US005922079A

United States Patent [19]

Booth et al.

[11] Patent Number: 5,922,079

[45] Date of Patent: Jul. 13, 1999

[54] AUTOMATED ANALYSIS OF A MODEL BASED DIAGNOSTIC SYSTEM

[75] Inventors: George L. Booth, Fort Collins; John M. Heumann; Douglas R. Manley, both of Loveland, all of Colo.

[73] Assignee: Hewlett-Packard Company, Palo Alto, Calif.

[21] Appl. No.: 08/951,287

[22] Filed: Oct. 16, 1997

Related U.S. Application Data

[63] Continuation of application No. 08/825,260, Mar. 27, 1997, abandoned, which is a continuation of application No. 08/612,645, Mar. 8, 1996, abandoned.

[51] Int. Cl.[6] ...................................................... G06F 11/26

[52] U.S. Cl. ................................ 714/26; 714/33; 714/47; 714/738

[58] Field of Search ............................ 371/26, 27.1, 2.1; 395/183.02, 183.09, 183.08, 183.22, 185.01, 184.01

[56] References Cited

U.S. PATENT DOCUMENTS

| | | | |
|---|---|---|---|
| 5,345,393 | 9/1994 | Ueda | 364/489 |
| 5,377,197 | 12/1994 | Patel et al. | 371/23 |
| 5,394,543 | 2/1995 | Hill et al. | 395/183.02 |
| 5,410,548 | 4/1995 | Millman | 371/27 |
| 5,414,716 | 5/1995 | Bershteyn | 371/27 |
| 5,485,471 | 1/1996 | Bershteyn | 371/22.5 |
| 5,657,240 | 8/1997 | Chakradhar et al. | 371/27.1 |
| 5,712,972 | 1/1998 | Kakkar | 395/183.02 |
| 5,724,504 | 3/1998 | Aharon et al. | 395/183.09 |
| 5,808,919 | 9/1998 | Preist et al. | 364/579 |
| 5,854,924 | 12/1998 | Rickel et al. | 395/185.05 |

FOREIGN PATENT DOCUMENTS

| | | | |
|---|---|---|---|
| 0654738 A1 | 5/1995 | European Pat. Off. | 11/22 |

OTHER PUBLICATIONS

Boppana et al., "Characterization and Implicit Identification of Sequential Indistinguishability", IEEE 10th International Conference on VLSI Design, pp. 376–380, Apr., 1996.

*Primary Examiner*—Robert W. Beausoliel, Jr.
*Assistant Examiner*—Scott T. Baderman
*Attorney, Agent, or Firm*—Augustus W. Winfield

[57] ABSTRACT

An automated analysis system that identifies detectability problems, diagnosability problems, and possible ways to change rank order of diagnoses in a diagnostic system and makes the problems and possible improvements visible to test programmers to aid in test improvement. Components that have no coverage and components that have inadequate coverage (according to a heuristic criteria) are identified as potential detectability problems. Components that are exercised by identical operations in all tests are identified as diagnosability problems. If an incorrect diagnosis is made, the automated analysis system identifies failing tests that have no coverage of any component in the true failure cause. In addition, if an incorrect diagnosis is made, the automated analysis system identifies ways of changing the rank order of diagnoses, including coverages that can be reduced and identification of operation violations that can be eliminated or deliberately added. If no historical data are available, a "diagnosability index" may be computed by randomly sampling from the set of possible failure syndromes and observing the frequencies with which ties occur among the weights of the top-ranked candidate diagnoses. After historical data becomes available, a diagnosability index may be computed from the frequency with which two candidate diagnoses are assigned identical weights by the model-based diagnostic system over a set of representative failures.

24 Claims, 3 Drawing Sheets

AUTOMATED ANALYSIS OF A MODEL BASED DIAGNOSTIC SYSTEM

CROSS REFERENCE TO RELATED APPLICATION(S)

This is a continuation of application Ser. No. 08/825,260 filed on Mar. 27, 1997, now abandoned which is a continuation of application Ser. No. 08/612,645 filed on Mar. 8, 1996, now abandoned.

FIELD OF INVENTION

This invention relates generally to automated diagnosis of failure causes from functional tests of a system. In particular, the invention relates to enhancements of a model-based diagnostic system including automated identification of test suite problems and possible modeling problems.

BACKGROUND OF THE INVENTION

Automated diagnosis of faults in a system can take many forms. One form of diagnosis is history-based. History-based diagnostic systems form a diagnosis based on a substantial body of historical failure data and symptoms. Gathering historical data requires repeated testing over time and assumes availability of true failure cause (TFC) information. An alternative approach is model-based. Model-based systems compare system responses to expected responses, based on computer models of the unit under test (UUT) or individual components. Model-based test systems are typically complex, often requiring manual entry of a substantial amount of data regarding design and structure. Models may require extensive data from experts or designers having specialized knowledge of the system to be tested. History-based test systems and complex model-based test systems are often impractical or are often not cost effective for UUT's that are in the prototype stage, UUT's that are undergoing frequent design revisions, UUT's that have short lifetimes, UUT's that are low-cost, or UUT's that are produced in limited quantities.

U.S. patent application Ser. No. 08/551,054 to Christopher Preist and David Allport (Preist et al), having the same assignee as the present application, discloses a model-based diagnostic system, based on functional tests, in which the modeling burden is greatly reduced. The model requires only a list of functional tests, a list of components exercised by each functional test along with the degree to which each component is exercised by each functional test, and (if available) the historical failure rate for individual components. The data to be entered may be rapidly and easily determined by test programmers or others familiar with, but not necessarily expert on, the UUT. Typically, the models may be developed by test programmers in a few days to a few weeks depending on the complexity of the UUT. The diagnostic system disclosed by Preist et al is particularly well suited to UUT's in the prototype stage, UUT's produced in limited quantities, UUT's with frequent design changes, UUT's having short life cycles, and UUT's where rapid turn on is important.

The diagnostic system disclosed by Preist et al is especially applicable to diagnosis of failures of electronic components on printed circuit boards. In general, however, the techniques apply to diagnosis of components in any system. For example, components may be printed circuit assemblies or other modules, components may be computers in a network, or components may be electromechanical components in an automobile or airplane. The general concepts are also applicable to medical diagnosis.

The present application deals with automated analysis of particular applications of the diagnostic system disclosed by Preist et al. Before stating the problems to be solved by the invention, a brief description of the diagnostic system is provided below. First, additional detail for some of the data bases is provided. Next, diagnosis is described, with two example methods of assigning weights for ranking candidate diagnoses. Then, the problems to be solved by the invention are described.

In this application, an operation is a process or action carried out by one or more functional tests. For example, a memory test may include a "read memory" operation and a "write memory" operation. Each operation exercises a specific set of components. In this application, the terms "coverage" or "utilization" may be used interchangeably to mean the extent to which a component is exercised by a particular test. Coverages may be specified either numerically (for example, as a percentage or as a fraction between 0 and 1) or categorically (for example, low, medium and high).

In the diagnostic system disclosed by Preist et al, the model comprises the following data structures:

(a) A data base of components and subcomponents. If components or subcomponents have had any prior testing or if failure rate data are available for components or subcomponents, these data are also included.

(b) A data base for mapping raw test results into categorical information (in the simplest case, pass/fail). For example, if the acceptable (pass) range for a particular voltage measurement is 4.5 V–5.5 V, a numerical test result of 4.0 V might map into a fail-low category.

(c) A functional test model in the form of a data base. Tests are defined as lists of operations. Each operation definition specifies each component or subcomponent exercised by the operation and an estimate of the coverage (degree exercised) of the component by the operation.

(d) Failure specifications, including indict lists and acquit lists. This allows the programmer to specify, if a particular failure occurs, a list of candidate components potentially responsible for the failure (indict list) and/or a list of components that must be functioning correctly to a certain degree (acquit list). For example, consider a functional test of an internal combustion automobile starting system. If the engine turns over at a specified RPM but does not start, the fuel system and ignition systems are suspect (indict list) but the battery and starter motor must be good (acquit list).

As an example of data for the above data bases, consider functional testing of a printed circuit board. One test is a memory test. Memory test includes two operations: access_memory and output_to_busport. The printed circuit board includes the following components: a central processing unit (CPU), a random access memory system (RAM), a databus, an input/output port (port), and a display module. In addition, the random access memory system includes memory and a decoder as subcomponents. The access_memory operation exercises 10% of the functionality of the CPU, 90% of the functionality of the RAM decoder, and 10% of the functionality of the RAM memory. The output_to_busport operation exercises 50% of the functionality of the databus and exercises 90% of the functionality of the port. The model then includes the following items:

components:
 CPU
 RAM
 databus
 port
 display module
RAM includes subcomponents:
 memory
 decoder
Operations:
 access_memory
  CPU; .1
  RAM, decoder; .9
  RAM, memory; .1
 output_to_busport
  databus; .5
  port; .9

The diagnostic system described above uses only data that are readily available at design time. Modeling does not require gathering of historical failure data of the system (although historical failure rates for individual components can be used if available). In the most simple embodiment, the diagnostic system merely requires entry of which components are tested by each operation. In an improved embodiment, the diagnostic system requires entry of the approximate degree to which each component is tested by each operation. This is data that can be provided by a designer or a test programmer. In particular, the diagnostic system does not require structural information (that is, data such as: the output of component A is connected to an input of component B), or failure models (that is, data such as: if test A fails then the most likely cause is component B) or behavioral models (that is, data such as: if both inputs to the NAND gate are high the output is low).

Once the model is defined, the functional tests are executed and failure data are collected. The diagnostic system then determines a diagnosis in three phases. In the first phase, a data abstraction module categorizes each test result as either passing or belonging to one of several possible failure categories. The data abstraction module is not relevant to the present application and is not described in detail here. In the second phase, given the failure results from the data abstraction module, candidate diagnoses are determined. A candidate diagnosis is a minimal set of components, which, if faulty, is capable of explaining all failing test results. Stated differently, every failing test must utilize at least one component in diagnosis D for D to be a candidate diagnosis. The method for determining candidate diagnoses is based on hitting sets, generally described for example in Reiter, R., "A Theory of Diagnosis from First Principles", *Artificial Intelligence* 32 (1987) 57–95. In the third phase, a relative weight or ranking is assigned to each of the candidate diagnoses. Two example methods of assigning weights are described below, but other types of evidential reasoning may also be used to rank possible diagnoses. Each of the methods described below has the advantage of being computationally efficient.

In the first method for assigning weights, an assumption is made that the probability of a test failing given that a particular component is known to be faulty is proportional to the utilization of that component by that test, and an assumption is made that components fail independently. These assumptions are reasonable in many situations. For example, if all failures are point failures, and all point failures are equally likely, then utilization and the probability of failure are proportional. The assumption leads to the following equation for assigning weights:

$$W(D,R)=p(D)*p(R|ID) \text{ * (operation violation penalty)} \quad \text{Equation (1)}$$

Where:

$D=\{C_1, C_2, \ldots C_M\}$ is a candidate diagnosis (a set of components presumed faulty).

$R=\{R_1, R_2, \ldots R_N\}$ is a set of test results.

p(D) is the prior probability of the candidate diagnosis. That is, p(D) is the probability of the components involved in the candidate diagnosis failing given only that some tests have failed (that is, with no information regarding which tests have failed or in what manner). This information is optional and may be omitted if unknown.

p(R|D) is the posterior probability of getting the set of test results R if the candidate diagnosis D is the set of faulty components. This is calculated from the degree of utilization factors in the functional test model. If more than one failing test is involved, the relevant factors are multiplied together. That is, $p(R|D)=p(R_1|D)*p(R_2|D) \ldots$ (operation violation penalty) is a number between zero and one, used to reduce the weight of an operation that fails in one test, causing the entire test to fail, yet passes in another test. If an operation penalty is appropriate, the value may be set to a system constant used for all operation penalties or variable penalties may be set for each operation. If no operation penalty is appropriate, the operation penalty is set to one (no penalty).

The method for assigning weights described above assumes that component failures are independent, assumes that test results are independent, and assumes that the degree of utilization of a component by a particular test is proportional to the probability of the test failing given that the component is faulty. Even if the assumptions are incorrect, the resulting computed rank order of relative probabilities may still be satisfactorily accurate for some applications. For further explanation of why the embodiment described above may provide satisfactory diagnoses even when the independence assumptions are not true, see Russek, E. "The Effect of Assuming Independence in Applying Bayes' Theorem to Risk Estimation and Classification in Diagnosis", *Computers and Biomedical Research* 16, 537–552 (1983).

In a second method for assigning weights, useful information can still be derived without making the assumption that the probability of a test failing given failure of a particular component is proportional to the utiliztion of that component by that test. In the second method, weights are computed as bounds on probabilites. A weight W is computed as follows:

$$W(D,R)=p(D)*\text{minimum}(\alpha_1, \alpha_2, \ldots \alpha_N)*\text{(operation violation penalty)} \quad \text{(Equation 2)}$$

where $\alpha_i$=(one minus utilization of $C_j$ by test i, where test i is a passing test, and $C_j$ is a member of D) or $\alpha_i$=1.0 when test i fails.

The "minimum" function in equation 2 results from the fact that an upper bound of a logical AND of a set of probabilities is the minimum of the probabilities, or more generally, their least upper bound. The probability of the event of all the passing tests given a failure of a component in diagnosis D is therefore bounded by the minimum of the probabilities of individual tests passing (or the minimum of the upper bounds on those probabilities). An additional refinement is made when subcomponents are present. For example, assume that a component C consists of subcomponents A and B. If either A or B fails, then C fails. In estimating a weight for C, weights $W_A$ for subcomponent A and $W_B$ for subcomponent B are computed. A lower bound of the logical OR is the greatest lower bound of this set of weights. That is, the probability that either subcomponent A or subcomponent B or both fail is bounded by the maximum of the lower bounds on the probabilities of failure of the individual subcomponents. Accordingly, the appropriate weight for C is then the maximum of $W_A$ and $W_B$.

In the diagnostic system disclosed by Preist et al and briefly described above, problems may occur in either the test suite or the model. For example, in the suite of functional tests, some components may not be exercised by any of the tests or may be only partially exercised. If no functional tests fail as a result of component failure or partial component failure, then the component failure will be undetectable. In addition, the diagnostic system may not be able to distinguish one component within a set of components or components may be inadequately distinguishable. Finally, inaccurate modeling data (for example, an incorrect estimate of the degree to which a component is exercised) may result in an incorrect diagnosis.

There is a need for further enhancement of the diagnostic system disclosed by Preist et al by providing automated analysis of the effectiveness of the test suite (ability of the model to detect and differentiate among potential faults), identification of possible test suite changes, and identification of possible modeling errors via automated analysis of incorrect diagnoses. The results of the analysis may then be used by test programmers to improve the particular application of the diagnostic system. In addition, there is a need for further enhancement of the performance of the diagnostic system disclosed by Preist et al by utilizing historical TFC data when such data are available.

SUMMARY OF THE INVENTION

An automated analysis and troubleshooting system is provided that identifies potential problems with the test suite (ability of the model to detect and discriminate among potential faults), and also identifies probable modeling errors based on incorrect diagnoses. The test suite and modeling problems are made visible to test programmers to aid in improvement of a particular application of the diagnostic system. In the automated test suite analysis, components that have no coverage or inadequate coverage are identified as detectability problems. Once fault detectability has been analyzed, the model is scanned for problems involving an inability to discriminate among potential faults (components exercised by identical operations in all tests). An overall measure of diagnosability (ability to discriminate among potential failures) may be computed. If no historical TFC data are available, a "diagnosability index" may be computed by randomly sampling from the set of possible failure syndromes and observing the frequencies with which ties occur among the weights of the top-ranked candidate diagnoses. If historical test results are available, a diagnosability index may be computed from the frequency with which two candidate diagnoses are assigned identical weights by the model-based diagnostic system over a set of representative failures.

Given one or more incorrect diagnoses, the analysis system identifies possible modeling changes that could alter the diagnoses. First, the analysis system identifies failing tests that have no coverage of any component in the true failure cause. Such cases indicate an error in modeling. In addition, the analysis system identifies ways of changing the model to change the rank order of diagnoses, including coverages that can be changed and identification of operation violations that can be eliminated or deliberately added. These identified changes are not automatically made, but are only identified as possible changes to be examined by a test programmer.

One significant advantage of any model-based test system is that historical TFC data are not needed. However, when historical TFC data becomes available, the model-based system disclosed by Preist et al can be combined in a complementary way with a diagnosis based on historical TFC data, and the combination is more broadly applicable and more accurate than a system based on either technique alone. Historical TFC data are used to provide confidence indicators on model-based diagnoses, to provide alarms when a process goes out of control, and to provide an independent means of diagnosis when sufficient data are available.

DETAILED DESCRIPTION OF THE PREFERRED EMBODIMENT OF THE INVENTION

Figure 1:
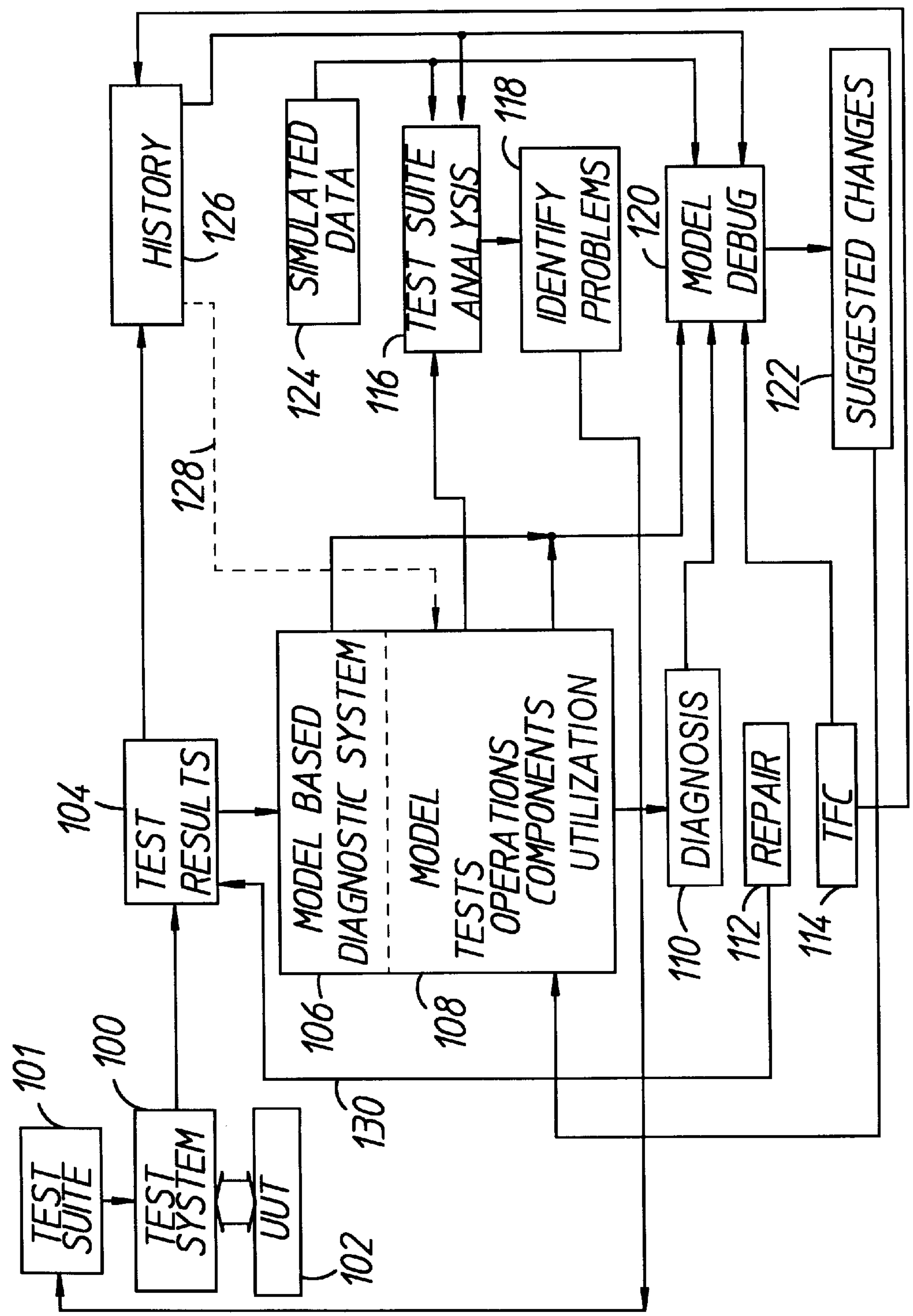
FIG. 1 is a block diagram of a test system and the associated environment, including the automated analysis of the invention.

FIG. 1 illustrates a test system and its associated environment. A test system 100 runs functional tests (test suite 101) on a UUT 102, generating pass/fail information or other test results 104. A model-based diagnostic system 106 (for example, the diagnositic system of Preist et al) provides a diagnosis 110 based on failure information from the test results 104 and a model 108. The model 108 includes information on tests, operations, components tested by operations, and utilization of the tested components by the associated operations. With diagnosis 110 as a guide, the UUT is repaired (box 112). During repair, the TFC 114 may be determined. Additional tests may be conducted during repair and these additional tests may also be modeled by the diagnostic system 106 (line 130).

In the invention, automated test suite analysis (116) analyzes the test suite 101 as described in the model 108 and generates possible improvements 118 to the test suite 101. Also in the invention, if a diagnosis 110 is not consistent with the TFC 114, then automated model debug 120 analyzes the model 108 for possible changes to the model that would result in a correct diagnosis 110. Test suite analysis 116 and model debug analysis 120 can be used with simulated data 124 or with historical data 126 when available. One advantage of the model-based diagnostic system 106 is that no historical data are required. However, when even partial historical data becomes available, the model-based diagnostic system can synergistically take advantage of that data, as indicated by dashed line 128 and discussed further in section IV below.

Note that the test system 100, the model based diagnostic system 106, test suite analysis 116 and model debug 120 are all typically computer or processor based. That is, software is executed by a processor within an automated test system or the test system is controlled by a separate computer. In general, the test suite analysis 116 and model debug 120 can be performed by a processor or computer used for the test system 100 or used for the model based diagnostic system 106. Alternatively, test suite analysis and model debug may be performed offline on a separate system or distributed among several systems. Note also that some of the statistical inferences involved may be determined by fuzzy logic or neural networks so that the word "automated" is not restricted to sequential execution of computer instructions.

I. DETECTABILITY ANALYSIS

Figure 2:
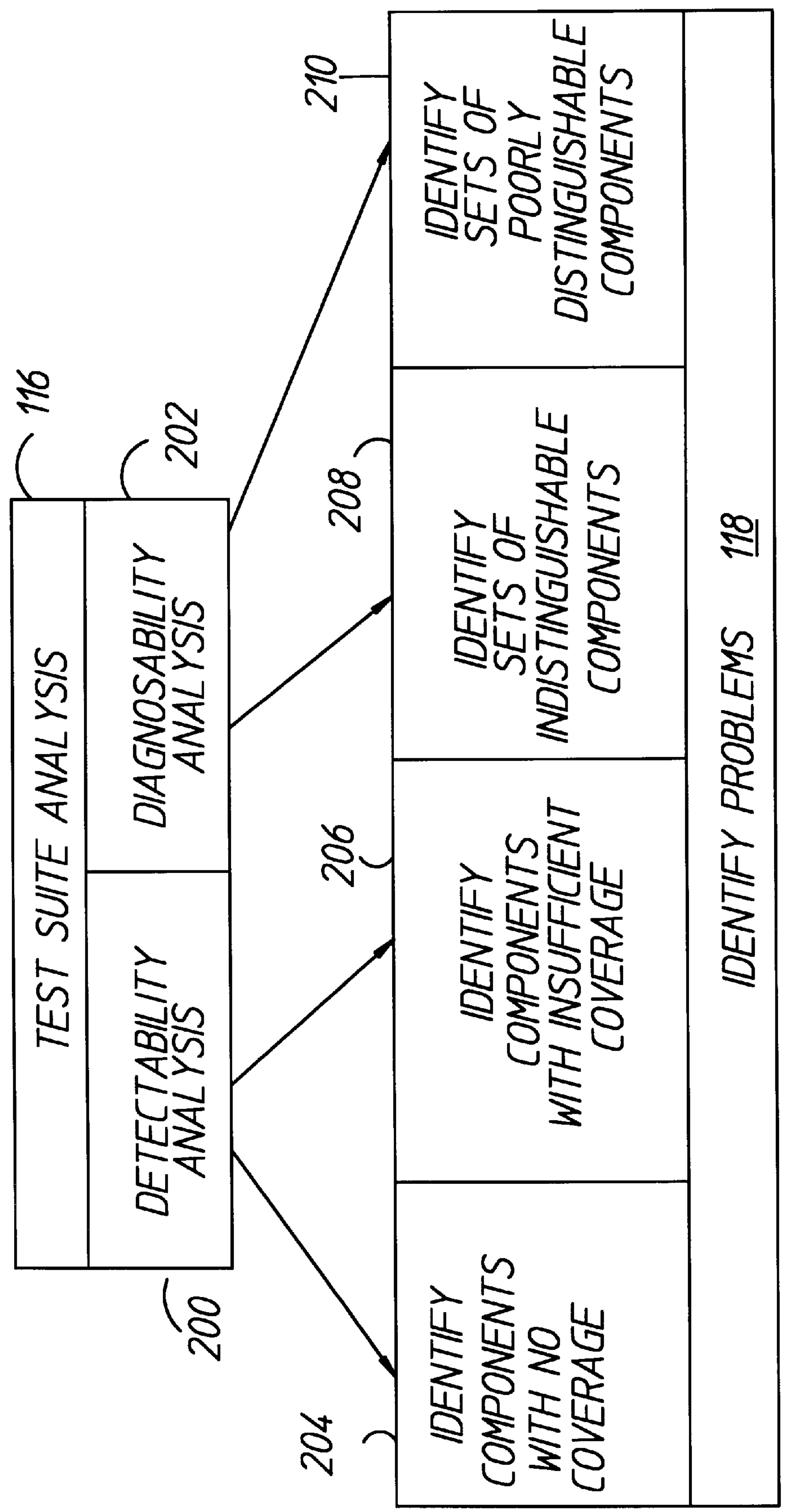
FIG. 2 is a block diagram showing additional detail for test suite analysis shown in FIG. 1.

FIG. 2 illustrates additional detail for test suite analysis (FIG. 1, 116). As illustrated in FIG. 2, test suite analysis is divided into two parts. In a first part, detectability analysis 200 is performed. A fault is detectable if one or more tests in the test suite fail when a UUT containing that fault is tested. Detectability analysis examines the set of tests modeled (assuming the model to be error free) and provides an analysis of how effective the set of tests will be at fault detection.

The model-based diagnostic system (FIG. 1, 106) is based on the degree to which the various test operations utilize individual components (and their subcomponents). Analysis of these utilizations directly yields information regarding the detectability of possible faults. If a component has no coverage in any test, then faults in that component will be not be detectable. If a component has only low coverage and only in a small number of tests, faults in that component may not be reliably detectable. Similarly, if a component contains multiple subcomponents, adequate coverage of each subcomponent is required if all possible faults are to be detectable. Detectability analysis proceeds in two stages. In the first stage, components or subcomponents with no coverage are flagged and indicated to the user (FIG. 2, block 204). In the example model in the background section, the display module is not exercised by any of the operations and a failure of the display module will not result in failure of any tests. Therefore, faults in the display module are not detectable.

In the second stage of detectability analysis, coverage analysis of the remaining components/subcomponents is performed. During the second stage, the system may be structured to either provide numerical indicators of the degree of fault detectability for particular components, or to simply flag those judged to have inadequate coverage (FIG. 2, block 206). Criteria during the second stage are primarily heuristic. For example, adequate coverage might be defined to consist of one or more tests with coverage judged to be high, two or more tests with coverage judged to be moderate, or five or more tests with coverage judged to be low. These criteria are meant as examples and it is to be understood that a variety of numerical or heuristic criteria may be used instead. In the example system model in the background section, the CPU is exercised by only one operation (access_memory) and only 20% of the functionality is exercised. Using the above example criteria, and the example system model, since the CPU is partially exercised by only a single operation, the CPU is under-exercised. For components that are under-exercised, a message is displayed or printed for a test programmer, indicating components that need additional testing (FIG. 2, 206).

II. DIAGNOSABILITY

As illustrated in FIG. 2, box 202, The test suite may also be automatically examined for diagnosability problems. In this application, the term "diagnosability" means the ability to uniquely identify faulty components within a larger set of candidates. A fault may be diagnosed correctly if the fault results in a pattern of test results (a syndrome) which is either uniquely characteristic or highly suggestive of that fault. Conversely, diagnosability problems arise when a fault is associated with a syndrome that results in equal weights being assigned to two or more candidate diagnoses. Diagnosability problems become particularly severe if two components can never be distinguished from each other by the test suite. Detectability is necessary but not sufficient for diagnosability. Analysis of diagnosability, or the ability to discriminate between components, is complicated by the fact that, in many cases, information about the prevalence of various faults is not available. As a result, diagnosability analysis is designed so that it will work in the absence of failure distribution information, but can exploit this information if it is available.

In diagnosability analysis, the model is scanned for components exercised via identical operations in all tests (box 208). Consider two components, C1 and C2. Assume that whenever C1 is exercised by an operation, C2 is also exercised by the same operation. Then, whenever C1 is a candidate diagnosis, C2 will be as well. Recall also that in the terminology of Preist et al, an operation is "violated" if it fails in one test, causing the entire test to fail, yet passes in another test. Operation violation penalties may be assessed on candidate diagnoses involved in operation violations. If C1 and C2 are found to be exercised by identical operations in all tests, the operation violation penalty term will always be identical in computing weights for these two diagnoses. Hence they can be distinguished only by their prior failure probabilities. If the prior failure probabilities are identical, the system will never be able to break ties between these diagnoses.

When modeling is done at the level of subcomponents, the above analysis becomes slightly more complicated. In this case, two components will always be indistinguishable (aside from prior failure probabilities) if their subcomponents can be matched in such a way that each subcomponent is used by operations identical to those of its matched partner in every test. While the problem of matching sub-components is combinatorially explosive, the number of subcomponents is typically small, and either direct search or hashing methods suffice.

In cases where the number of subcomponents becomes too large for such methods to be practical, approximate analysis may be used. In the simplest form of approximate analysis, all the subcomponent operations (and associated coverages) are simply propagated to the component level and the analysis is performed at that level. For example, propagation to the component level can be done either by recording the presence (or absence) of utilization or by recording the maximum utilization of any subcomponent of each component. In either case, comparison may be performed at the component level. It is also possible to compare components with differing numbers of subcomponents by partial propagation. For example, suppose we wish to compare components A and B, and A has more subcomponents than B. By aggregating some of A's subcomponents into pseudo-subcomponents, it may be possible to find a grouping that matches the coverages of B in all operations. This grouping should be reported as a potential diagnosability problem. However, components that appear identical by these methods may still be resolved by the test suite, since this approach does not fully reflect operation violation penalties, or the complete computation of the coverage-related weight term. As a result, components judged identical by these approximate means should be reported as having "similar" coverage, rather than as being indistinguishable by any set of test results (box 210).

A "diagnosability index" may be computed as 1.0 minus the frequency with which two candidate diagnoses are assigned identical weights by the model-based diagnostic system over a set of representative failures. Either simulated data (FIG. 1, 124) or historical TFC data (FIG. 1, 126) may be used for such analysis. If failure distribution information is available, the simulated failures may be created accordingly. Even when neither historical data nor distribution information are available, a diagnosability index may be computed by randomly sampling from the set of possible failure syndromes and observing the frequencies with which ties occur among the weights of the top-ranked candidate diagnoses.

Finally, the test suite may be evaluated for overall accuracy by analysis of historical data (FIG. 1, 126). For example, the system could compute the mutual information (or other statistical or information theoretic measures) between the model-based diagnosis and the distribution of TFC's recorded in the database.

III. SUGGESTED CHANGES GIVEN AN INCORRECT DIAGNOSES

Analysis of detectability and diagnosability may be performed before the diagnostic system is actually used. Further model and test suite improvement may be provided after one or more cases are misdiagnosed by the model-based system. That is, the diagnosis (set of components) predicted by the diagnostic system is not the set of components which were actually faulty in the particular case (TFC). For each misdiagnosed case, automatic identification of possible changes requires both the associated test results and the TFC. Historical TFC data may be used, if available.

Figure 3:
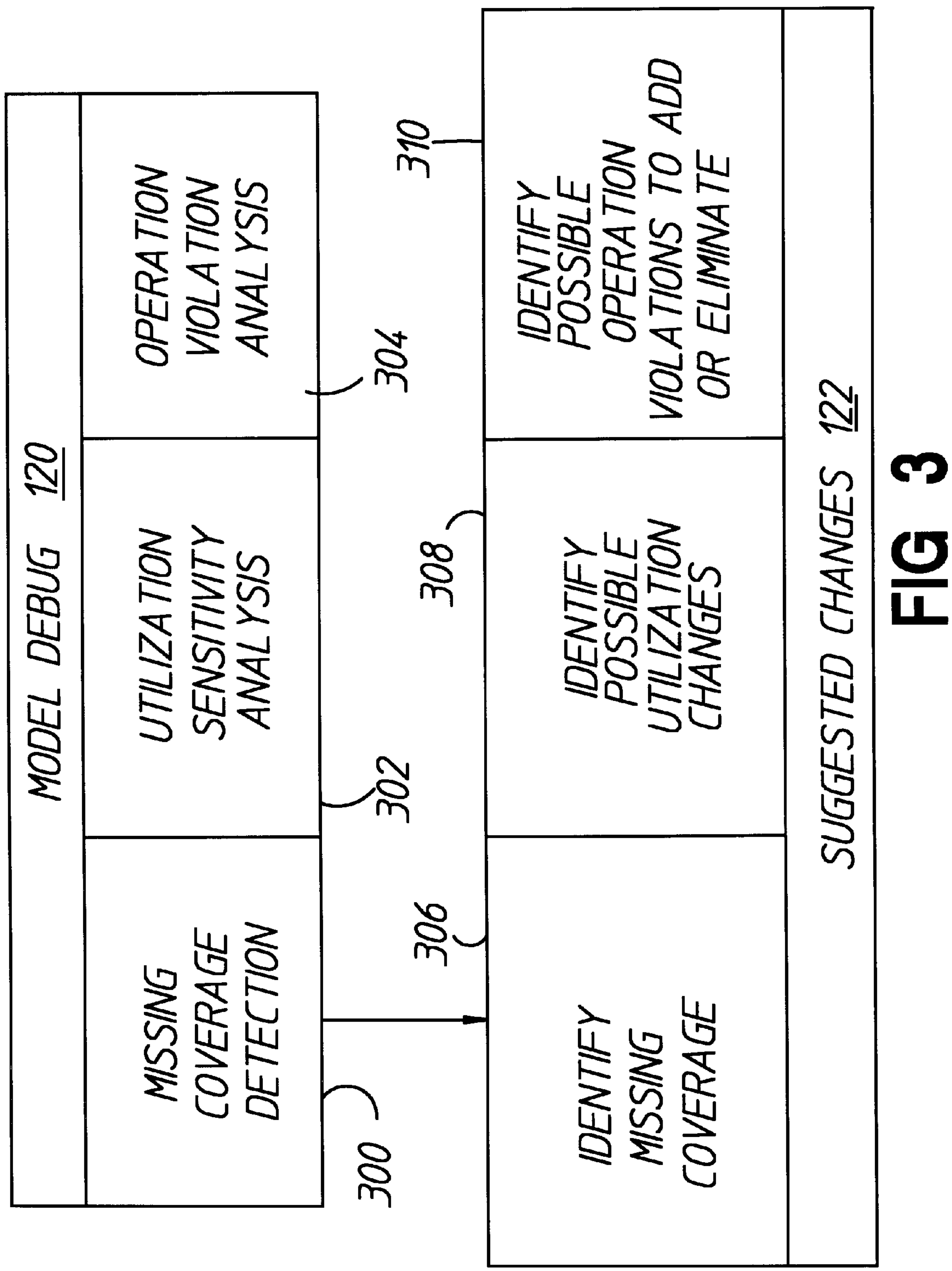
FIG. 3 is a block diagram showing additional detail for debug shown in FIG. 1.

FIG. 3 illustrates additional detail for debug of the model based on incorrect diagnoses. As illustrated in FIG. 3, model debugging (FIG. 1, 120) is divided into three parts (300, 302 and 304), but additional debug analyses are possible as discussed below.

In FIG. 1, the diagnostic system 106 generates a list of candidate diagnoses, and then weights are computed for each candidate diagnosis. One candidate diagnosis (110) is selected based on its weight. If the TFC 114 is not included among the candidate diagnoses computed by the model-based system 106, or if the TFC 114 is included but does not have the highest weight among the candidate diagnoses, the debug system 120 is used to help determine why. A candidate diagnosis must explain all the failing tests. Therefore, in troubleshooting, the starting point is to determine if any of the failing tests have no coverage of any component in the TFC. If failing tests are found that have no coverage of any component in the TFC, a comment is printed or displayed to inform the user that adding coverage of at least one component in the diagnosis to each such test will remedy the problem. In FIG. 3, section 300 depicts analysis of missing coverages and section 306 depicts display or printing of identified possible missing coverages. Note that this is similar to but not identical to analysis for detectability. In detectability analysis (FIG. 2, 200), the analysis system determines whether components are exercised by any tests. In troubleshooting after an incorrect diagnosis, the debug system (FIGS. 1 and 3, 120) determines whether every failing test exercises at least one component in the TFC.

Note that changes involving the addition of unique coverage to multiple tests will generally be less likely than those involving a small number of corrections. However, it is not unusual to find errors in which the same coverage or operation has inadvertently been omitted from a large number of tests.

The debug system 120 also determines whether the TFC is a candidate diagnosis, but is assigned a weight that is lower than that of some other candidate diagnosis. In this situation, the goal of the debug system 120 is to determine: (a) how to get a particular diagnosis to be ranked in a particular position, or (b) how to raise or lower the weight assigned to a particular diagnosis. Since (a) can always be decomposed as a series of one or more operations of type (b), only (b) will be discussed in detail.

In equation (2) from Preist et al (given in the background section above), the weights assigned to each candidate diagnosis are determined by the product of: (1) a prior failure probability term, (2) an operation violation penalty term (often identically 1.0), and (3) the maximum (over subcomponent-level hitting sets) of the minimum (over tests) of 1.0 minus the coverage in any passing test. First, consider just the term comprising the maximum (over subcomponent-level hitting sets) of the minimum (over tests) of 1.0 minus the coverage in any passing test. For simplicity, assume without loss of generality that only a single hitting set is involved, so the "max" operation may be ignored. Components in the diagnosis under consideration will frequently show utilization by a large number of passing tests with varying degrees of coverage. Since the weight is proportional to the maximum coverage in any passing test, the number of coverages which actually affect the final weight is typically much smaller than the number of passing tests. For example, suppose u1 is used with coverage 0.1 in test {t1}, with coverage 0.5 in tests {t2, t3, t4, t5}, and with coverage 0.9 in test {t6}. Changing the coverage of u1 in any of t1through t5 will not alter the weight assigned to diagnosis {u1} unless at least one of the coverages is made larger than 0.9. On the other hand, even a small change in the coverage in t6 directly alters the assigned weight. This phenomenon is typical of the embodiment of the diagnostic system using equation (2), and enables a direct search for a small number of utilization parameters which, if changed, would alter the relative ranlking of the weights assigned various diagnoses. Referring back to FIG. 3, the search for utilization parameters that would alter the relative ranking is depicted as the second part of debug (utilization sensitivity analysis 302) and the identified possible utilization changes are printed or displayed (box 308).

This approach is a special application of the classical method of sensitivity analysis. Sensitivity analysis attempts to determine the effect on an output variable (in this case the weight) of an infinitesimal change in any of the parameters. In typical model-based systems, sensitivity analysis is of limited utility due to the fact that varying sensitivities to a large number of parameters are frequently encountered. In the embodiment of the diagnostic system using equation (2), however, sensitivity is zero except for those coverages identical to the maximum coverage in any passing test of some component contained in the diagnosis. When multiple hitting sets are involved, taking the maximum over subcomponent-level hitting sets further reduces the number of parameters affecting the final weight. Hence it is frequently possible to identify a very small number of parameters which, if altered, will modify the weight assigned to a diagnosis. Note that this approach is applicable whenever the underlying formulation confers sensitivity to a small subset of the much larger number of parameters comprising the model. For example, many fuzzy logic systems fall into this category. The approach is thus not limited to the particular embodiment described by Preist et al.

The debug system 120 also identifies ways to raise or lower weights by modifying operation violation penalties (FIG. 3, 304). The weight of a diagnosis can be raised by avoiding operation violation penalties or the weight of a diagnosis can be lowered by generating operation violation penalties. Operation violation penalties may be avoided (to raise the weight of the TFC candidate diagnosis) by removing a particular violated operation from one or more tests so that it is not used in both passing and failing test(s), or by adding coverage of the faulty components in at least one failing test via addition of operations which are not themselves violated. Conversely, penalties may be imposed (to lower the weight of an incorrect candidate diagnosis) by ensuring that a violation is present (i.e. that a particular operation is used in both passing and failing tests), and that the violated operation provides the only utiliztion in the set of failing tests of some component in the diagnosis. The diagnostic system maintains lists of violated operations, of passing and failing tests, and of candidate diagnoses and their associated weights and penalties. As a result, the above search is feasible although combinatorially intensive. In practical embodiments, it may be appropriate to perform a limited rather than an exhaustive search, thus detecting automatically only a subset of all possible alterations to operation violation penalties.

Possible changes to prior failure probabilities should also be identified for consideration by a test programmer. Prior failure probabilities are generally based on historical failure rates or subjective probabilities. As a result, altering prior failure probabilities to correct a single diagnosis is rarely appropriate (and is not depicted in FIG. 3). Nonetheless, the debug system can suggest this possibility when the alternative is modification of a large number of coverages. In general, for all model changes suggested by the automated system, test programmers should review the actual tests to determine what model changes are appropriate before accepting the automatically generated suggestions.

Certain diagnoses may not be reported because they are not minimal (at the component level) or are judged too complicated. For example, if the diagnosis {u1} is sufficient to explain all the test failures, {u1+u2} will not be reported, since it is a super-set and hence non-minimal. Similarly, if there are N-component diagnoses which explain the test failures, one may choose not to report any diagnoses involving N+k or more components, where k is a non-negative integer (typically 2). Either of these reasons for not listing a particular diagnosis is easily detected automatically (by checking for super-sets of candidate diagnoses, and by comparing cardinality with that of the smallest candidate diagnosis, respectively).

IV) USE OF HISTORICAL DATA

Historical data may be used in conjunction with the model-based diagnostic system as follows:

(a) Providing cases for performance evaluation of the model-based system.

(b) Replaying historical syndromes to choose one or more on which to debug the model.

(c) Providing cases for automatic (or manual) debugging.

(d) Allowing evaluation of the effect of changes suggested by debugging on overall performance.

(e) Providing a source of cases for test coverage analysis.

(f) Determining if suggested changes are validated by historical data.

Additionally, because model-based diagnosis and diagnosis based on history of past TFC's are largely complementary, a system which utilizes both techniques simultaneously is more broadly applicable, more accurate, and more able to provide a confidence indicator on each diagnosis than a system based on either technique alone. For example, one of the strengths of model-based diagnosis is that the model can be constructed using data available at design time. As a result, diagnoses are available from the first failure, long before sufficient historical TFC data can be accumulated. Additionally, even after historical data collection is well under way, the model-based system provides the preferred way for diagnosis of rare syndromes which are absent from the historical database or present in such low numbers that the TFC statistics are not considered reliable. Conversely, diagnosis based on the frequency with which various TFC's have been seen in association with a particular syndrome requires accumulation of statistically significant data on a particular syndrome before a reliable diagnosis for that syndrome can be made. Once adequate data are available, however, the historical approach is typically preferable for stationary processes. This approach most accurately reflects the repair actions which fixed defects associated with the syndrome in question previously. Additionally, historical diagnosis frequently allows an objective confidence indicator to be placed on the weights assigned to candidate diagnoses. For example, assume 10,000 instances of the syndrome in question have been seen; in 6,400 cases the TFC was u1, and in 3,600 cases u2. Assuming components fail independently according to a stationary Poisson process, the standard deviation may be estimated by the square root of the number of observations. Hence, we could assign weights 64±8 to u1 and 36±6 to u2. Similar results are available under alternative distributional assumptions. Additionally, if historical data are collected in real time as is frequently done in statistical quality control, alarms may be raised when anomalous failure rates are seen (i. e. if the process goes out of control or becomes non-stationary).

While historical and model-based diagnosis each have several factors in their favor, a combined system has virtually all of the above advantages with none of the drawbacks. Additionally, in a tightly-integrated system, having two independent means of diagnosis provides an additional confidence indicator. When history-based and model-based diagnosis agree on the most likely failure cause, for example, confidence that this is likely to be the correct diagnosis is higher than it would be with either system alone. When historical data are not available for a particular syndrome, the model-based diagnosis can be relied on. Finally, when historical and model-based diagnosis are both available but disagree, the historical diagnosis will generally be more reliable if the statistics are solid and the process is still in control.

An additional advantage arises when users may wish to construct a model-based system for a UUT for which historical data are already available. For example, users may wish to add model-based diagnostics to a line which is already in production. In this case, the historical database may be used to guide or check construction of the model. For example, suppose one extracted from the database all single-component TFC's and arranged them by failing component. Consider, for example, the syndromes associate with TFC component C1. Tests which fail in any of these syndromes must each have some coverage of C1. Similarly, tests which always pass when C1 is the TFC are unlikely to have high coverage of C1 (although it is not prohibited). Changes suggested by automatic debugging can be analyzed against historical data using heuristics of this type.

The foregoing description of the present invention has been presented for purposes of illustration and description.

It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of identifying improvements to a model-based test system, the model-based test system including a test suite and a model, the method comprising the following steps:

(a) automatically identifying improvements to the test suite;

(b) automatically identifying improvements to the model; and (c) outputting the improvements identified in steps (a) and (b).

2. The method of claim 1, step (a) further comprising:

identifying components in which failures are not likely detectable.

3. The method of claim 2, step (a) further comprising:

identifying components that are not exercised by any test.

4. The method of claim 2, step (a) further comprising:

identifying components that are inadequately exercised according to a predetermined criteria.

5. The method of claim 1, step (a) further comprising:

identifying pairs of components for which one component cannot be distinguished from the other.

6. The method of claim 5, step (a) further comprising:

identifying sets of components that are exercised by identical operations in all tests.

7. The method of claim 1, step (a) further comprising:

identifying pairs of components for which one component is unlikely to be distinguished from the other.

8. The method of claim 1, wherein the model-based diagnostic system has misidentified a particular set of components as the cause of a set of failing tests instead of identifying the true failure cause components as the cause of the set of failing tests, step (b) further comprising:

identifying probable modeling errors causing the misidentification.

9. The method of claim 8, step (b) further comprising:

identifying components of the true failure cause that are not exercised by the set of failing tests.

10. The method of claim 8, step (b) further comprising:

performing utilization sensitivity analysis on the particular set of components.

11. The method of claim 8, step (c) further comprising:

identifying ways of changing the misidentification by modifying operation violations.

12. A method of identifying improvements to a test suite, the test suite based on a model of a system, the mode not including a description of connection of components in the system, the method comprising the following steps:

(a) automatically identifying components, the failure of which has a probability of detectability by the test suite that is low but greater than zero; and (b) outputting identities of components identified in step (a).

13. The method of claim 12, further comprising the steps of:

identifying components that are not exercised by any test.

14. The method of claim 12, step (a) further comprising:

identifying components that are inadequately exercised according to a predetermined criteria.

15. A method of identifying improvements to a test suite, the test suite based on a model of a system, the model not including a description of connection of components in the system the method comprising the following steps:

(a) automatically identifying sets of components that are exercised by identical operations in all tests; and (b) outputting identities of components identified in step (a).

16. A method of identifying improvements to a test suite, the method comprising the following steps:

(a) automatically identifying pairs of components for which one component has a probability that is low but greater than zero from being distinguished from the other; and (b) outputting identities of the components identified in step (a).

17. A method of identifying improvements to a model-based diagnostic system, wherein the model-based diagnostic system has misidentified a particular set of components as the cause of a set of failing tests instead of identifying the true failure cause components as the cause of the set of failing tests, the method comprising:

(a) automatically identifying components of the true failure cause that are not exercised by the set of failing tests; and (b) outputting identities of components identified in step (a).

18. A method of identifying improvements to a model-based diagnostic system, wherein the model-based diagnostic system has misidentified a particular set of components as the cause of a set of failing tests instead of identifying the true failure cause components as the cause of the set of failing tests, the method comprising:

(a) automatically identifying a way to increase a diagnostic weight for the true failure cause components; and (b) outputting the identity of the way of increasing a diagnostic weight identified in step (a).

19. The method of claim 18, step (a) further comprising:

identifying a coverage that may be altered for a set of components within the true failure cause components, resulting in an increased diagnostic weight for the true failure cause components.

20. The method of claim 18, step (a) further comprising:

identifying a particular operation that may be removed from at least one test, the particular operation exercising at least one of the true failure cause components and the particular operation having an operation violation before removal from at least one test and having no operation violation after removal from at least one test.

21. The method of claim 18, step (a) further comprising:

identifying a particular operation that may be added to at least one failing test, the additional operation being one that exercises at least one of the true failure cause components and does not have an operation violation.

22. A method of identifying improvements to a model-based diagnostic system, wherein the model-based diagnostic system has misidentified a particular set of components as the cause of a set of failing tests instead of identifying the true failure cause components as the cause of the set of failing tests, the method comprising:

(a) automatically identifying a way to decrease a diagnostic weight for the particular set of components; and (b) outputting the identity of the way of decreasing a diagnostic weight identified in step (a).

23. The method of claim 22, step (a) further comprising:

identifying a coverage that may be altered for the particular set of components, resulting in a decreased diagnostic weight for the particular set of components.

24. The method of claim 22, step (a) further comprising:

identifying a particular operation that may be added to at least one failing test, the particular operation being one that exercises at least one of the particular set of components and will have an operation violation when added.

* * * * *